United States Patent [19]

Jewett

[11] 4,265,859
[45] May 5, 1981

[54] APPARATUS FOR PRODUCING SEMICONDUCTOR GRADE SILICON AND REPLENISHING THE MELT OF A CRYSTAL GROWTH SYSTEM

[75] Inventor: David N. Jewett, Harvard, Mass.
[73] Assignee: Energy Materials Corporation, Harvard, Mass.
[21] Appl. No.: 88,366
[22] Filed: Oct. 26, 1979

Related U.S. Application Data

[62] Division of Ser. No. 911,089, Jun. 2, 1978, abandoned.

[51] Int. Cl.[3] .................. B01J 12/02; B01J 19/02; C01B 33/02
[52] U.S. Cl. .................. 422/199; 422/235; 422/240; 423/350
[58] Field of Search .............. 422/129, 199, 235, 240, 422/241, 198 US; 423/349, 350

[56] References Cited

U.S. PATENT DOCUMENTS

| | | | |
|---|---|---|---|
| 2,849,293 | 8/1958 | Wendell, Jr. et al. | 422/240 X |
| 2,912,311 | 11/1959 | Mason et al. | 422/199 |
| 3,023,087 | 2/1962 | Enk et al. | 422/199 |
| 3,042,494 | 7/1962 | Gutsche | 422/199 X |
| 3,118,737 | 1/1964 | Blocher, Jr. | 422/129 X |
| 4,054,641 | 10/1977 | Carman | 423/349 X |
| 4,057,396 | 11/1977 | Matovich | 423/349 X |
| 4,102,764 | 7/1978 | Harvey et al. | 423/350 X |
| 4,102,767 | 7/1978 | Mazelsky et al. | 423/350 X |
| 4,132,763 | 1/1979 | Schmidt et al. | 423/349 X |
| 4,162,291 | 7/1979 | Arcella et al. | 422/198 |
| 4,176,166 | 11/1979 | Carman | 423/350 |

Primary Examiner—Joseph Scovronek
Attorney, Agent, or Firm—Morse, Altman, Oates & Dacey

[57] ABSTRACT

A method and related apparatus are provided for producing on a semi-continuous basis polycrystalline silicon and melt replenishment for a crystal growth crucible. The silicon is deposited in low density form on the inner walls of a multi-walled reaction chamber by delivering gaseous $HSiCL_3$, $SiH_4$, or the like, and reducing gas if needed, through the chamber which is heated to the reaction temperature of the feed gas. After a certain amount of silicon has been produced, the chamber temperature is raised sufficiently to melt down the silicon which is then used to replenish a crystal growth crucible. The operations are then cyclically repeated.

The apparatus includes a reaction chamber having a multi-walled configuration to maximize the interior surface area on which the silicon is deposited. A drain trap such as a U-shaped tube, or the like, is connected to the bottom of the reaction chamber and provided with heating elements. Silicon collected on the walls of the reaction chamber, when periodically melted, flows through the drain trap and a delivery tube to a crystal growth system. By selectively adjusting the temperature in the trap, either above or below the melting point of the silicon, the silicon is alternately liquified or solidified so that the liquid/solid transition of the silicon in the trap acts as a valve between the reaction chamber and the crystal growth system.

8 Claims, 4 Drawing Figures

APPARATUS FOR PRODUCING SEMICONDUCTOR GRADE SILICON AND REPLENISHING THE MELT OF A CRYSTAL GROWTH SYSTEM

This is a division of application Ser. No. 911,089 filed on June 2, 1978 and now abandoned.

BACKGROUND OF THE INVENTION

1. Field of the Invention

This invention relates generally to the production of high purity silicon and more particularly is directed towards a new and improved method and associated apparatus involving the reduction of $HSiCL_3$, or the like, in a reaction chamber to obtain silicon and periodically melting the silicon for transfer through a U-shaped delivery tube to a crystal growth apparatus for replenishment of molten silicon in a crucible from which the crystal is grown.

2. Description of the Prior Art

There is a growing demand for polycrystalline silicon of high purity for uses for such products as solar cells, semi-conductors, or the like. At present the techniques and equipment used in the production of silicon for these purposes are both complex and expensive. The high cost of prior techniques and equipment is the result of a number of factors which include inefficient reaction chambers, time consuming batch processes, low volume output and high energy requirements.

Because of the complexity of the purification process semi-conductor grade silicon is very expensive. Perfect crystals of silicon can be grown by the Czochralski method in which a seed crystal is rotated while being slowly withdrawn from a crucible of molten silicon. If the temperature and rates of rotation and pulling are controlled with sufficient precision, the silicon in the crucible is converted into a single perfect crystal. At this stage the crystal can be doped, if desired, with a suitable quantity of an additive, such as boron, for example.

The semiconductor grade silicon can be obtained by various means such as by reacting technical silicon with dry hydrochloric acid gas and converted to trichlorosilane $SiHCL_3$ which is then purified and thereafter decomposed at a temperature between 800° and 1000° C. The process and equipment used therein are more fully disclosed in U.S. Pat. No. 2,943,918. U.S. Pat. No. 3,012,862 also describes methods for producing elemental silicon.

Proposals which have been considered for reducing the cost of polycrystalline silicon, especially that intended for large area silicon solar cell arrays, generally fall into three major areas, the first being improved efficiency of the Siemens process, new chemical reactions which will produce a much greater yield of semi-conductor grade silicon than the Siemens process, and techniques to produce silicon which are intermediate between metallurgical grade and semi-conductor grade silicon, a solar cell grade. The improvements in the Siemens process have been mainly in process conditions, such as pressure, temperature and feed stock composition. The development of a new chemical process requires not only that the process can produce the required yield of high quality silicon, but also that the feed stocks can be produced in high volume and quality at a reasonable price. This is a long, expensive process involving high capital investment.

Other techniques have involved the deposition of silicon within a tube of silicon or fused silica. While this approach theoretically implies the possibility of low energy requirements by the use of external heaters and insulation, the need to use tubular silicon necessitates the production of such tubes which adversely affects the cost of the technique. The use of a fused silica tube has been done, but the lack of a suitable method for removing the silicon without destroying the tube has prevented this procedure from achieving major cost savings.

In both of the above systems, the deposition tubes are broken up and used to charge a crucible in a separate procedure. This, of course, results in a substantial amount of handling and limits the deposition technique to that where high density deposits are produced.

Accordingly, it is an object of the present invention to provide improvements in the method and associated apparatus for producing high grade polycrystalline material for use as solar cells or the like. Another object of the invention is to provide a method and associated apparatus for producing polycrystalline silicon and melt replenishment on a low-cost, semi-continuous basis.

SUMMARY OF THE INVENTION

This invention features the method for producing silicon and providing melt replenishment, comprising the steps of delivering through a reaction chamber feed gas such as $HSiCL_3$, $SiH_4$, or the like and a reducing gas if needed, heating the chamber to the reaction temperature of the gas whereby silicon will be deposited on the walls of the chamber, periodically raising the temperature in the chamber to melt the silicon, and draining the melted silicon from the bottom of the chamber. The liquid silicon may be delivered directly to a crucible for replenishment purposes in a silicon crystal growing apparatus.

This invention also features an apparatus for the semi-continuous production and replenishment of silicon, comprising a reaction chamber characterized by a high deposition surface area to volume ratio obtained as by multi-walled construction defining a plurality of concentric annular passages through which a feed gas is delivered and exhausted. Heating elements are provided for raising the temperature of the chamber to the reaction point of the gas and, at times, to the melting point of silicon deposited on the walls of the chamber. A drain trap is connected to the bottom of the chamber and is also provided with heating means whereby molten silicon may be drained from the chamber, and by selectively controlling the temperature of the silicon in the drain trap the silicon may be liquified or solidified and thereby act as a valve between the reaction chamber and the crucible connected to the drain trap.

DETAILED DESCRIPTION OF THE PREFERRED EMBODIMENTS

Figure 1:
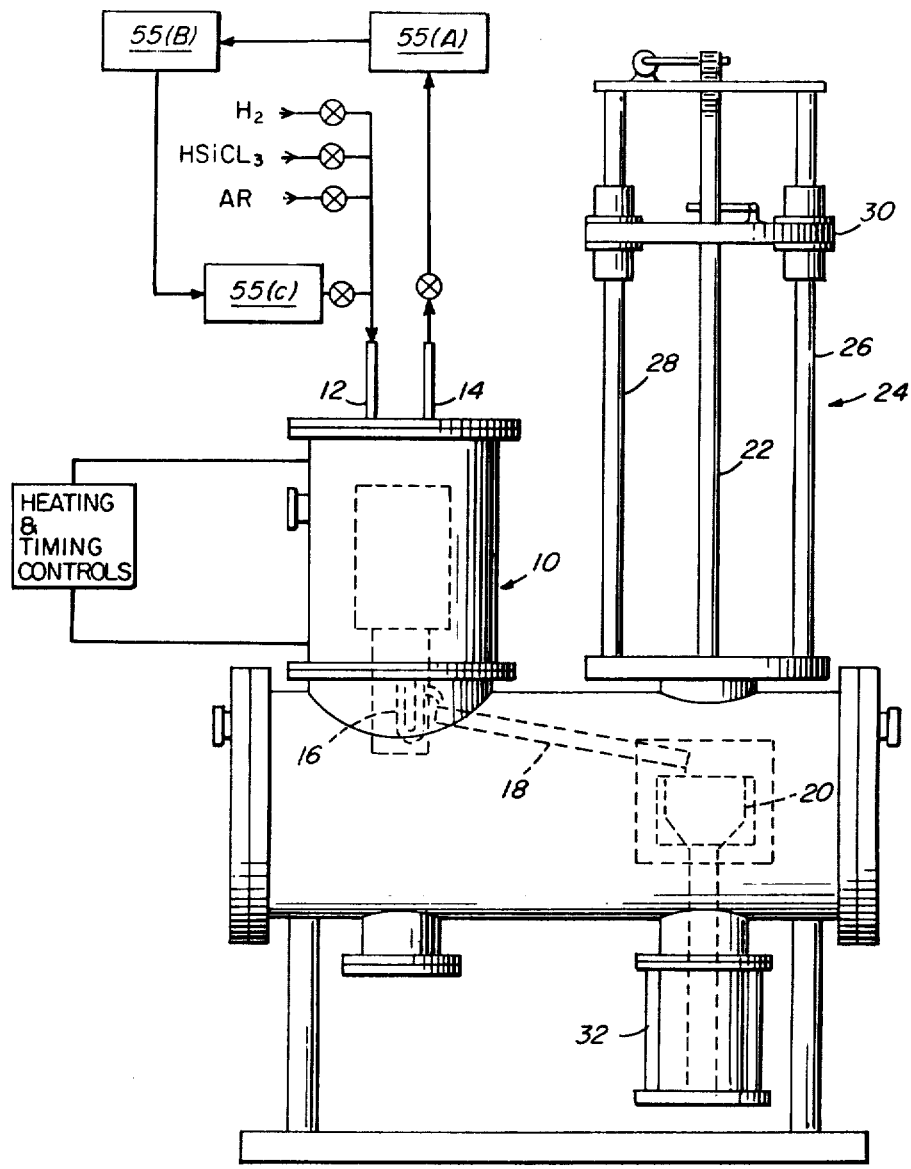
FIG. 1 is a view in side elevation, somewhat schematic, of a combination silicon reaction chamber and crystal growing apparatus embodying the invention.

Referring now to the drawings and to FIG. 1 in particular, the reference character 10 generally indicates a reaction chamber adapted to reduce a feed gas, such as $HSiCL_3$, with $H_2$ to silicon by operating the chamber at the appropriate reaction temperature, typically between 900° to 1200° C. and normally in cycles of several hours each. The gas is delivered into the chamber 10 by a feed tube 12 with the exhaust gases exiting through a tube 14. The reaction chamber 10 is provided with heating elements adapted to not only operate the chamber at the reaction temperature, but also, as required, to raise the temperature to a level above the melting point of silicon.

In general, when the feed gas flows through the chamber at the reaction temperature, at least a portion of the gas will be reduced, with the result that silicon will deposit on the walls of the chamber. The reaction taking place in the chamber may be considered as the sum of the following two parallel reactions:

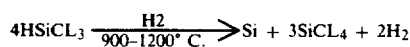

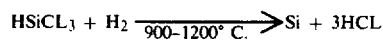

$$4HSiCL_3 \xrightarrow[900-1200°C.]{H_2} Si + 3SiCL_4 + 2H_2 \quad 1.$$

$$HSiCL_3 + H_2 \xrightarrow[900-1200°C.]{} Si + 3HCL \quad 2.$$

When a sufficient amount of silicon has been deposited, it is removed by raising the temperature in the chamber to above the silicon melting point, about 1412° C., with the silicon then collecting at the bottom of the chamber where it is drained out through a U-shaped drain tube 16 and delivered by means of a transfer tube 18 to a crucible 20 forming a part of a crystal growing apparatus. The crystal growing apparatus is generally organized about the crucible 20 which contains a quantity of molten silicon. The crystal growth zone is at the surface of the molten silicon and the crystal is removed by a vertical crystal puller 22 which withdraws the crystal slowly by means of the mechanism generally indicated by the reference character 24. This mechanism includes a pair of vertical support rods 26 and 28 on which is mounted a carriage 30 engaging the puller 44. The mechanism is adapted to slowly withdraw the puller 22 as the crystal forms at the lower end thereof. A motorized pedestal 32 is provided below the apparatus to support the crucible 20. The pedestal support rotates the crucible to provide the rotational motion with respect to the vertically moving puller.

Figure 3:
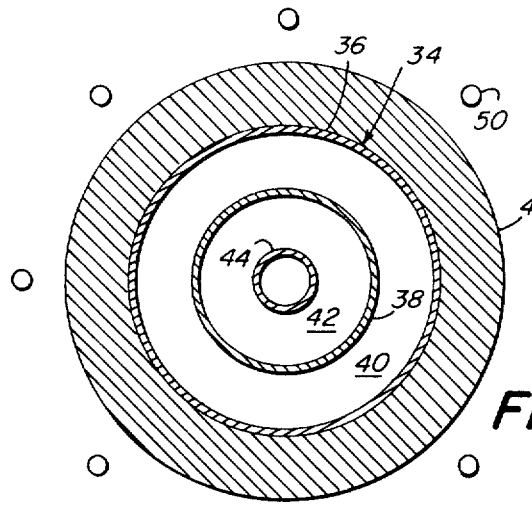
FIG. 3 is a cross-sectional view taken along the line 3—3 of FIG. 2 and, FIG. 4 is a sectional view in side elevation showing a modified drain trap.
Figure 2:
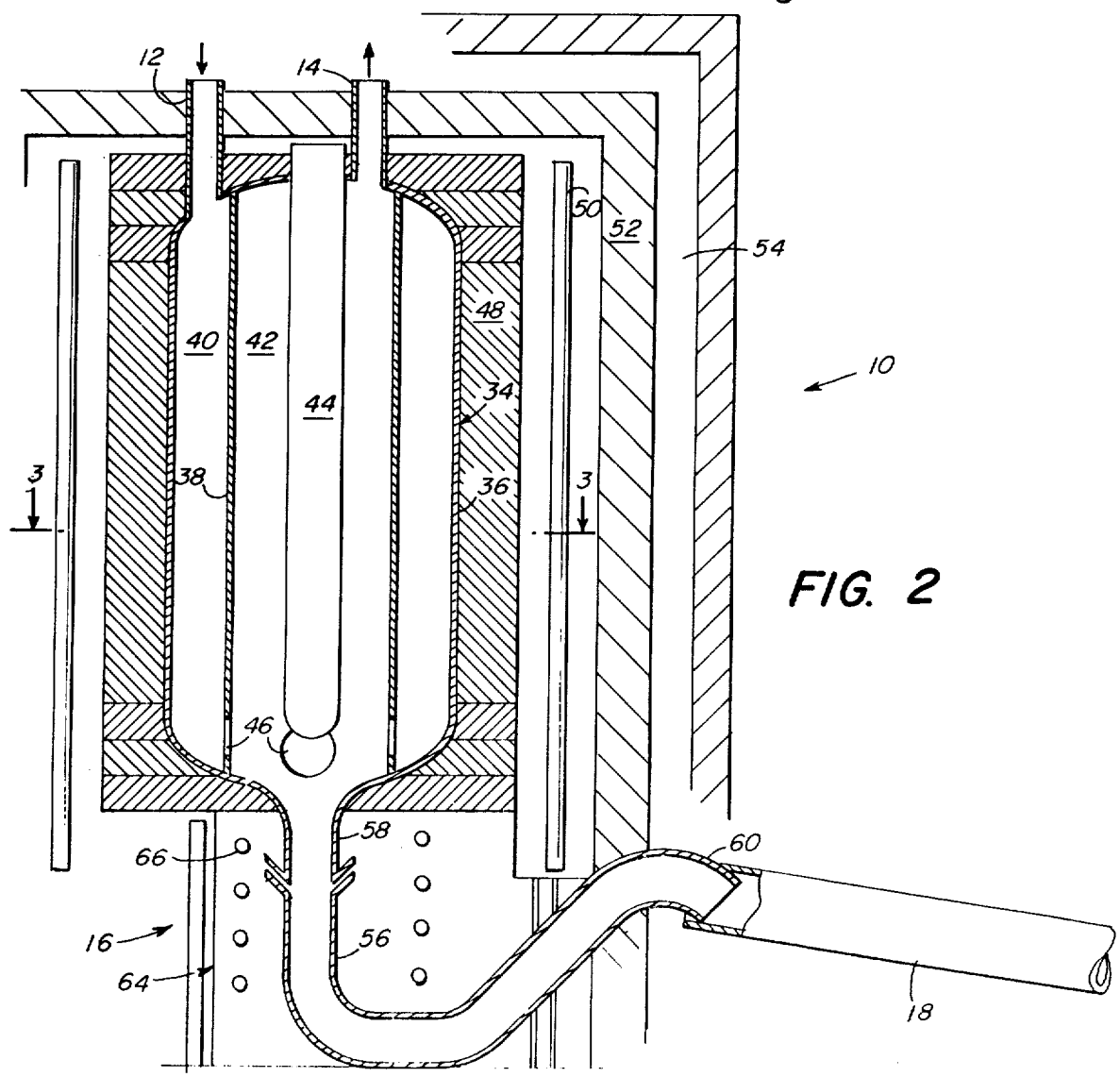
FIG. 2 is a sectional view in side elevation showing details of the reaction chamber.

Referring now more particularly to FIGS. 2 and 3, there are shown details of the reaction chamber. The reaction chamber includes a vessel 34 comprised of a generally cylindrical outer wall 36, preferably of fused quartz and arranged in a generally upright position. Other suitable high temperature materials such as graphite, silicon carbide, or the like, may also be used in fabricating the reaction chamber. Mounted in spaced concentric relation to the outer wall 36 is an inner annular wall 38, also of fused quartz or the like and extending from top to bottom of the chamber to form a pair of concentric annular passages 40 and 42 between the outer wall 36 and coaxial thimble 44. The passages 40 and 42 communicate with one another by means of ports 46 formed in the lower end of the inner wall 38. The outer annular passage 40 is connected to the inlet tube 12, while the inner annular passage 42 communicates with the exhaust tube 14. The flow of feed gas, therefore, is down through the tube 12 into the outer annular chamber 40, thence inwardly through the ports 46 into the inner annular passage 42, thence out of the reaction chamber through the exhaust tube 14.

Substantially fully enclosing the outer walls 36 of the reaction vessel 34 is a support block 48, preferably made of solid graphite. The graphite block serves to distribute heat uniformly to the reaction vessel as well as to provide support for it at high temperatures. Disposed outwardly of the graphite block are heating elements 50 which may be in the form of straight rods or in a coil, as desired. Surrounding the heating elements 50 are insulating walls 52 extending above, below and entirely about the block and heating elements. The reaction chamber may be further insulated by means of a water cooled outer jacket 54.

The thimble 44 in the center of the reaction chamber may be used to carry another heating element or to house a temperature probe, if desired.

The silicon valve 16 located at the bottom of the reaction chamber 10 is comprised of a U-shaped tube 56, one leg of which is connected to a funnel-shaped neck 58 formed at the bottom of the vessel 34. The other leg of the tube 56 extends out of the housing enclosing the chamber and is provided with a downwardly bent spout portion 60 located above the upper end of the transfer tube 18. The U-shaped tube 56 enclosed within a graphite support block 64 is provided with a separate heating element 66.

In practice, the reaction chamber is operated as follows: The heating elements 50 are energized to raise the temperature of the reaction chamber to the desired reaction temperature, typically about 1000° C. Once this temperature has been reached, feed gas is admitted to the chamber through the tube 12. The gas passes through the chamber and the heat within the chamber produces a reaction which causes the silicon to collect on the surfaces of the walls of the reaction chamber. The exhaust gas, including unreacted portions thereof, move through the exhaust tube 14 for recycling. When a sufficient amount of silicon has been collected on the walls of the reaction chamber, the flow of feed gas is stopped and the chamber is purged with a suitable inert gas such as argon, for example. Preferably a slight positive pressure is maintained in the reaction chamber to aid in supporting the walls of the vessel during the melt down portion of the cycle. The temperature of the reaction chamber is then raised to above the melting point of the silicon, typically to about 1450° C. Also, the heating elements 66 are adjusted to heat the tube 56 to a point also above the melting point of the silicon. When the silicon melts it will flow down from the reaction chamber through the tube 56 and thence via the transfer tube to the crucible. The recycling system is comprised of a distillation system including several stills 55 connected in stages 55A, B and C and feeding reprocessed $HSiCL_3$ back to the inlet tube 12.

All of the melted silicon is not removed from the tube 56 but rather the U-shaped configuration of the tube forms a trap which will retain a sufficient amount of silicon to provide a gas tight seal between the reaction chamber and the crucible. Once the desired amount of silicon has been drained out, the temperature of the reaction chamber is returned to its normal reaction temperature of 900° to 1200° C. The temperature of the tube 56 is allowed to cool down to a point below the melting temperature of the silicon and typically is allowed to cool to about 850° C. Once the silicon has solidified in the U-shaped tube 56 the reaction chamber is properly sealed and feed gas is again introduced to the reaction chamber and the reaction cycle is repeated.

The silicon valve 16 preferably is a deep U-shaped tube and its function is to close the reactor system off from the crystal growth system during the crystal growth and silicon deposition stages. Its operation is controlled by raising the temperature above the melting point during the melt down of the reactor and dropping the temperature to about 850° C. during the reaction period. The depth of the bend in the U-tube will determine the extent of positive pressure allowed during melt down. If crystal growth is to take place at significantly reduced pressures it would be necessary to raise the crystal growth chamber to 1ATM pressure to avoid draining all the silicon from the U-tube.

Figure 4:
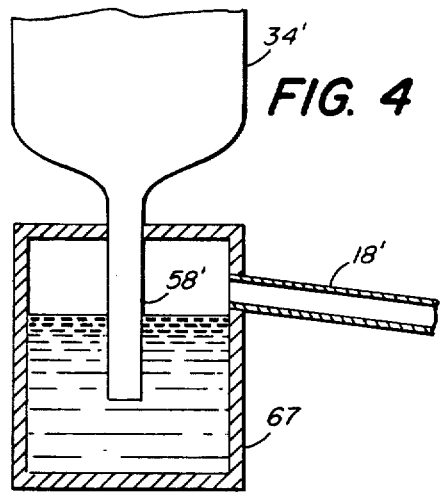

In FIG. 4 there is shown a modified drain trap 16' that may also be used in place of the U-shaped tube described above. The trap 16' includes a vessel 67 into which molten silicon drains from the reaction chamber 20 down an elongated neck 58', the lower end of which terminates below the surface of the silicon. A transfer tube 18' communicates with the top of the vessel 67 and connects to the crucible for replenishment thereof. Suitable heating elements are provided to achieve the liquid/solid transition of the silicon for valving action.

The silicon transfer tube 18 between the silicon valve 16 and the crucible 20 typically is fabricated from fused silica or the like and is provided with support, heaters, controls and insulation since the tube must be heated above 1415° C. during the melt down operation.

In practice the transfer tube 18 and the crucible should be movable with respect to one another so that the lip of the tube does not overhang the crucible during crystal growth. This may be achieved conveniently by mounting the tube 18 for limited movement to and away from the crucible. A rack and pinion or other suitable mechanism may be used to move the tube in and out of position.

Insofar as the reaction temperature is maintained at a continuous temperature of at least 900° C. substantial energy savings result. In a batch type procedure presently used, the reactor would normally be heated through cycles from ambient temperature to the reaction temperature, maintained at the reaction temperature for a period of time sufficient to produce sufficient silicon and then cooled down to ambient temperature to allow removal of the silicon deposit. The deposit then must be separately heated from ambient to the melting point of the silicon. The full cycle of heating and cooling of the reaction chamber and the melting of the silicon is eliminated since the present procedure provides a semi-continuous production of silicon and melt replenishment.

The silicon deposition process, according to this invention, can be operated at maximum yield and rate efficiency since maximizing substrate surface area and optimizing temperature/pressure flow rate parameters for a given reactor volume can be allowed without concern for the density of the product since the silicon will be melted out of the reactor. Since the temperature of the reaction chamber will normally range only from 900° to about 1450° C., none of the losses produced by the batch process will result and far more efficient insulation and heating elements may be used. In the Siemens process, rods on which the silicon is deposited are heated directly by passing a current through them. The reaction chamber is water cooled and there is a tremendous radiant heat loss between the hot silicon and the chambers. The reaction chamber of the present invention, however, is heated and provides a substantial increase in the deposition surface area for a given reactor volume. This geometry allows for the use of insulation between the hot reactor chamber and the ambient environment and is a major source of energy savings. Further, because of the increase in the ratio of the reaction surface to the gas low cross-sectional area, increased yield of silicon can be obtained from a given flow rate of $HSiCL_3$. Also, since the silicon produced by the reaction chamber is delivered directly in molten form as replenishment to the crucible, all handling of the polycrystalline silicon is eliminated. The equipment and method can be used in replenishing Czochralski, EFG, Stepanov, dendritic web, and most other forms of crystal growth from the melt.

The energy savings calculated for the present invention appear to be significant. Using the present method and apparatus it has been calculated that 1 Kg of silicon will be produced per hour of operation, with a power input of 2.5 kwhr/kg. This can be compared to the 400 kwhr/kg normally associated with producing polycrystalline silicon by the Siemens technique. The power used in melting down the silicon is calculated to be about 5 kw for about 15 minutes, or 1.25 kwhr/kg Energy/kg—$2.5+1.25=3.75$ kwhr/kg. The reduction in total energy/kg from 400 kw/hr to 4 kw/hr is a significant energy and economic savings which would be reflected in the cost of the end product.

The feed gas to the reactor preferably is $HSiCL_3$ although other suitable gases may be used to advantage. For example, $SiH_4$ may be utilized although at present its cost is substantially higher than that of $HSiCL_3$.

The invention can be practiced efficiently on a small scale thus providing substantial advantages in cost over many systems which require very large capital investments to achieve economical operation.

While the invention has been described with particular reference to the illustrated embodiment, numerous modifications thereto will appear to those skilled in the art. For example, in place of the reaction chamber illustrated and described herein, the draining technique may be used to advantage with other silicon production systems and reaction chambers of different configurations and operation. By incorporating a liquid/solid transition drain trap of the sort disclosed herein with other silicon producing reactors the advantage of semi-continuous production can be achieved with such other reactors.

Having thus described the invention, what I claim and desire to obtain by Letters Patent of the United States, is:

1. Apparatus for producing high purity silicon and melt replenishment for a crystal growth zone on a semi-continuous basis, comprising
   (a) a vessel defining a reaction chamber,
   (b) conduit means including inlet and outlet tubes connected to said chamber for delivering and exhausting a flow of heat-reactive, silicon-bearing feed gas through said chamber,
   (c) first heating means operatively associated with said chamber for selectively and cyclically heating said chamber to the reaction temperature of said gas whereby silicon from said feed gas will deposit on walls of said chamber and to the melting point of silicon deposited in said chamber whereby the deposited will melt and flow to the lower portion said chamber, (d) a U-shaped drain trap connected to the lower portion of said vessel for draining molten silicon from said chamber for delivery to said zone during a melting phase of the chamber operation and when containing a sufficient quantity of silicon to block at least one part of said trap forming a seal between said zone and said chamber during a reaction phase of the chamber operation, and, (e) second heating means operatively associated with said drain trap for separately controlling the temperature thereof whereby silicon collected in said trap can be cyclically melted and solidified to control the flow of silicon from said chamber.

2. Apparatus according to claim 1 wherein said vessel includes a plurality of concentric spaced walls defining a plurality of annular chambers communicating with one another the outermost of said annular chambers being connected to one of said tubes and the innermost of said annular chambers being connected to the other of said tubes whereby said feed gas will flow through all of said chambers during a reaction phase of the chamber operation.

3. Apparatus according to claim 1 including a graphite block surrounding said vessel and in surface contact therewith.

4. Apparatus according to claim 1 wherein said vessel is fabricated of fused quartz.

5. Apparatus according to claim 1 including a tubular thimble extending along the vertical centerline of said chamber.

6. Apparatus according to claim 1 including distillation means connected to said vessel for recycling unreacted exhaust gas from said chamber and returning it thereto.

7. Apparatus according to claim 3 including thermal insulating means enclosing said heating means, said block and said vessel.

8. Apparatus for producing high purity silicon on a semi-continuous basis, comprising, (a) a reactor having an inlet port adapted to receive a flow of heat-reactive, silicon producing material, for reaction in said reactor and an outlet port adapted to exhaust therefrom, (b) reactor heating means operatively associated with said reactor for selectively heating said reactor to the reaction temperature of said material to cause silicon to be formed from said material and collect in said reactor and to the melting point of silicon produced in said reactor whereby the collected silicon can be melted and allowed to flow to a lower portion of said reactor, (c) a U-shaped liquid/solid transition drain trap connected to said lower portion of said reactor for draining molten silicon from said reactor during a melting phase of the reactor operation and forming a solid seal during a reaction phase thereof and, (d) separate trap heating means operatively associated with said trap for raising and lowering the temperature of silicon in said trap above and below the melting point to control the flow of silicon from said reactor.

* * * * *